(12) United States Patent
Huh et al.

(10) Patent No.: US 7,855,034 B2
(45) Date of Patent: Dec. 21, 2010

(54) REFLECTING MASK, APPARATUS FOR FIXING THE REFLECTING MASK AND METHOD OF FIXING THE REFLECTING MASK

(75) Inventors: Sung-Min Huh, Yongin-si (KR); Suk-Ho Lee, Seoul (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 639 days.

(21) Appl. No.: 11/782,032

(22) Filed: Jul. 24, 2007

(65) Prior Publication Data
US 2008/0057412 A1    Mar. 6, 2008

(30) Foreign Application Priority Data
Aug. 31, 2006    (KR) .................. 10-2006-0083289

(51) Int. Cl.
*G03F 1/00* (2006.01)
(52) U.S. Cl. ......................................................... 430/5
(58) Field of Classification Search ................ 430/5; 361/230, 234; 378/35
See application file for complete search history.

(56) References Cited

U.S. PATENT DOCUMENTS

| | | | |
|---|---|---|---|
| 6,352,803 B1 | 3/2002 | Tong et al. | |
| 7,092,231 B2 * | 8/2006 | Hoeks et al. | 361/234 |
| 7,623,334 B2 * | 11/2009 | Mizuno et al. | 361/234 |

FOREIGN PATENT DOCUMENTS

| | | |
|---|---|---|
| JP | 2002-299228 | 10/2002 |
| JP | 2005-210093 | 8/2005 |

* cited by examiner

*Primary Examiner*—Stephen Rosasco
(74) *Attorney, Agent, or Firm*—F. Chau & Associates, LLC

(57) ABSTRACT

In a reflecting mask, an apparatus for fixing the reflecting mask and a method of fixing the reflecting mask, voltages are applied to elements of a conductive pattern spaced apart from each other on a rear face of the reflecting mask to fix the reflecting mask by using electrostatic forces. A flatness of the fixed reflecting mask is measured, and the electrostatic forces provided to portions of the reflecting mask are selectively adjusted in accordance with a measured result obtained from the measuring part, such that the reflecting mask is horizontally fixed and is substantially flat.

4 Claims, 6 Drawing Sheets

REFLECTING MASK, APPARATUS FOR FIXING THE REFLECTING MASK AND METHOD OF FIXING THE REFLECTING MASK

CROSS-REFERENCE TO RELATED APPLICATION

This application claims priority under 35 USC §119 to Korean Patent Application No. 2006-83289 filed on Aug. 31, 2006, the contents of which are herein incorporated by reference in their entireties.

BACKGROUND OF THE INVENTION

1. Technical Field

The present disclosure relates to a reflecting mask, an apparatus for fixing the reflecting mask and a method of fixing the reflecting mask. More particularly, the present disclosure relates to a reflecting mask used in a photolithography process using an extreme ultraviolet light beam, an apparatus for fixing the reflecting mask and a method of fixing the reflecting mask.

2. Discussion of Related Art

A size of a semiconductor device has been substantially reduced in order to achieve a high degree of integration. Thus, a photolithography process capable of achieving a high resolution has been required to manufacture a highly integrated semiconductor device. For example, an exposure process using deep ultraviolet employs a light having a wavelength of about 248 nm to expose a target having a size of about 250 nm to the light. The exposure process using the deep ultraviolet also employs a light having a wavelength of about 193 nm to expose a target having a size of about 100 to about 130 nm to the light. When an exposure process using an extreme ultraviolet light is employed, a target having a size of about 5 to about 70 nm is exposed to the light.

The exposure process using the extreme ultraviolet light is different from the exposure process using the deep ultraviolet light. Most material absorbs the extreme ultraviolet light, so that a reflecting mask is used instead of a transmitting mask to perform the exposure process using the extreme ultraviolet light. The reflecting mask generally includes a reflecting layer formed on a substrate and an absorbing layer pattern formed on the reflecting layer. The absorbing layer absorbs the extreme ultraviolet light. The reflecting layer has a multi-layered structure including other kinds of layers that are alternately formed. As one example, the reflecting layer includes a molybdenum (Mo) layer and a silicon (Si) layer. As another example, the reflecting layer includes a beryllium (Be) layer and a silicon layer.

The reflecting mask includes a conductive layer formed on a rear face of the substrate, and the conductive layer of the reflecting mask is fixed to an electrostatic chuck. The exposure process is performed in a state where the reflecting mask is fixed to the electrostatic chuck. In case that the fixed reflecting mask is not flat, a focus error and a pattern shift are generated on the substrate in the exposing process.

SUMMARY OF THE INVENTION

Example embodiments of the present invention provide a reflecting mask that is horizontally fixed onto an electrostatic chuck.

Example embodiments of the present invention also provide an electrostatic chuck horizontally fixing a reflecting mask.

Example embodiments of the present invention also provide a method of horizontally fixing a reflecting mask.

In an example embodiment of the present invention a reflecting mask includes a substrate, a reflecting layer, an absorbing mask pattern and conductive layer patterns. The reflecting layer is formed on a front face of the substrate to reflect an extreme ultraviolet light. The absorbing mask pattern is formed on the reflecting layer to absorb the extreme ultraviolet light. The conductive layer patterns are spaced apart from one another on a rear face of the substrate. The conductive layer pattern may fix the substrate to an electrostatic chuck providing an electrostatic force.

The conductive layer patterns may be disposed in substantially a matrix shape. Alternatively, the conductive layer patterns are disposed in a concentric circle shape.

The reflecting mask may further include an insulating layer pattern formed between the conductive layer patterns to insulate the conductive layer patterns from one another. A height of the conductive layer pattern may be substantially the same as a height of the insulating layer pattern.

In accordance with an example embodiment of the present invention, an apparatus for fixing a reflecting mask includes a body, protrusions, an electrode, a power supplying part, and a controller. The protrusions are formed on the body such that the protrusions correspond to conductive patterns spaced apart from one another on a rear face of the reflecting mask. The protrusions include an insulating layer and a dielectric layer formed on the insulating layer. The electrode is formed in the dielectric layer of the protrusions. The power supplying part supplies a voltage to the electrode to generate an electrostatic force for fixing the reflecting mask. The controller controls the amount of voltage provided to the electrode.

The apparatus may further include a measuring part measuring a flatness of the reflecting mask fixed to the protrusions by the electrostatic force. The controller may adjust the amount of voltage applied to the electrodes in accordance with a result measured by the measuring part so that the reflecting mask is horizontally fixed onto the protrusions.

The conductive layer patterns may be disposed substantially in a matrix shape. Alternatively, the conductive layer pattern may be disposed in a concentric circle shape.

In accordance with an example embodiment of the present invention, there is provided a method of fixing a reflecting mask. In the method, the reflecting mask is fixed by using electrostatic forces. A flatness of the fixed reflecting mask is measured. The electrostatic forces provided to portions of the reflecting mask are selectively adjusted in accordance with a measured result obtained from the measuring part, so that the reflecting mask is horizontally fixed.

Measuring the flatness of the fixed reflecting mask and selectively adjusting the electrostatic forces may be repeatedly performed until the flatness of the fixed reflecting mask is in a predetermined range.

To fix the reflecting mask, a conductive layer pattern spaced apart from an adjacent conductive layer pattern may make close contact with a protrusion corresponding to the conductive layer pattern. A voltage is applied to an electrode formed inside each protrusion to generate the electrostatic force. The electrostatic forces provided to the reflecting mask may be selectively controlled by adjusting the voltages respectively applied to the electrodes in the protrusions.

According to an example embodiment of the present invention, the apparatus for fixing the reflecting mask includes the protrusions spaced apart from one another. In addition, the reflecting mask includes the conductive patterns spaced apart from one another such that the conductive patterns respectively correspond to the protrusions. The apparatus may adjust the electrostatic forces provided to the conductive patterns of the reflecting mask, so that the reflecting mask may be horizontally fixed onto the apparatus.

Accordingly, an exposure process may be performed with the reflecting mask that has been horizontally fixed. Therefore, a pattern shift and a focus error generated on the wafer may be prevented in the exposure process.

BRIEF DESCRIPTION OF THE DRAWINGS

Example embodiments of the present invention will be understood in more detail from the following descriptions taken in conjunction with the accompanying drawings, wherein.

DESCRIPTION OF EXEMPLARY EMBODIMENTS

Exemplary embodiments of the present invention are described more fully hereinafter with reference to the accompanying drawings, in which exemplary embodiments of the present invention are shown. The present invention may, however, be embodied in many different forms and should not be construed as limited to the example embodiments set forth herein. Rather, these example embodiments are provided so that this disclosure will be thorough and complete, and will fully convey the scope of the present invention to those of ordinary skill in the art.

Figure 1:
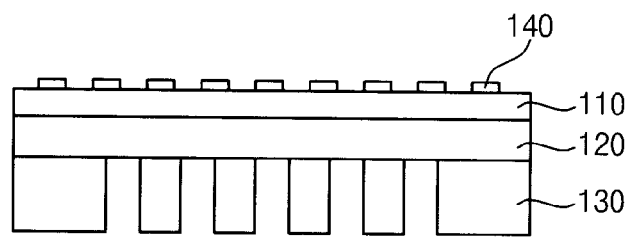
FIG. 1 is a cross-sectional view illustrating a reflecting mask in accordance with an example embodiment of the present invention.

FIG. 1 is a cross-sectional view or side elevation illustrating a reflecting mask in accordance with an example embodiment of the present invention.

Referring to FIG. 1, the reflecting mask 100 includes a substrate 110, a reflecting layer 120, an absorbing layer pattern 130 and a conductive layer pattern 140.

For example, the substrate 120 may be a quartz substrate, a silicon substrate, a glass substrate, and the like.

The reflecting layer 120 may be formed on a front face of the substrate 110. The reflecting layer 120 reflects extreme ultraviolet light. The reflecting layer 120 may be a multi-layered structure including at least one molybdenum layer and at least one silicon layer that are alternately formed. The molybdenum (Mo) layer or the silicon (Si) layer may be located at an uppermost portion of the reflecting layer 120. The silicon layer, however, may be preferably located at the uppermost portion of the reflecting layer 120, because a native oxide layer formed on a surface of the silicon layer has superior stability.

Examples of a metal that may be used for the reflecting layer 120 instead of molybdenum may include scandium (Sc), titanium (Ti), vanadium (V), chrome (Cr), iron (Fe), nickel (Ni), cobalt (Co), zirconium (Zr), niobium (Nb), technetium (Tc), ruthenium (Ru), rhodium (Rh), hafnium (Hf), tantalum (Ta), tungsten (W), osmium (Os), iridium (Ir), platinum (Pt), copper (Cu), palladium (Pd), silver (Ag), gold (Au), and the like. In addition, the silicon reflecting layer 120 may include silicon carbide, silicon nitride, silicon oxide, boron nitride, bdellium nitride, bdellium oxide, aluminum nitride, aluminum oxide, and the like, instead of silicon.

The absorbing layer 130 may be formed on the reflecting layer 120 to absorb the extreme ultraviolet light. The absorbing layer 130 may include tantalum nitride (TaN), tantalum (Ta), chrome (Cr), titanium nitride (TiN), an alloy of copper and aluminum (Al—Cu), nickel silicon (NiSi), tantalum silicon nitride (TaSiN), titanium silicon nitride (TiSiN), aluminum (Al), and the like.

The conductive layer pattern 140 may be formed on a rear face of the substrate 110. Thus, an electrostatic chuck (not shown) providing electrostatic force may have the reflecting mask 100 affixed thereto. The electrostatic chuck holds the rear face of the reflecting mask 100 on which the conductive layer pattern 140 is formed.

Figure 2:
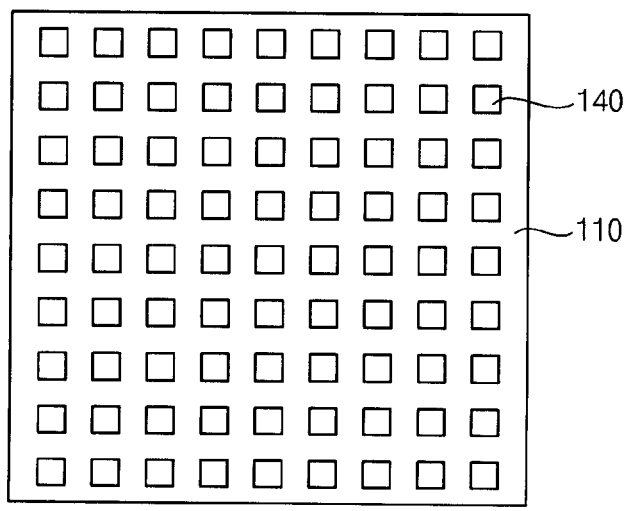
FIG. 2 is a plan view illustrating the conductive layer pattern of the reflecting mask in FIG. 1.

FIG. 2 is a plan view illustrating the conductive layer pattern 140 of the reflecting mask in FIG. 1.

Referring to FIG. 2, the elements of the conductive layer pattern 140 may be spaced apart from one another. For example, elements forming the conductive layer pattern 140 may be disposed substantially in a matrix. Thus, different electrostatic forces may be provided to the several elements of the conductive layer pattern 140, respectively. Accordingly, the reflecting mask 100 may be horizontally maintained by adjusting the electrostatic forces provided to the individual elements forming the conductive layer pattern 140.

Figure 3:
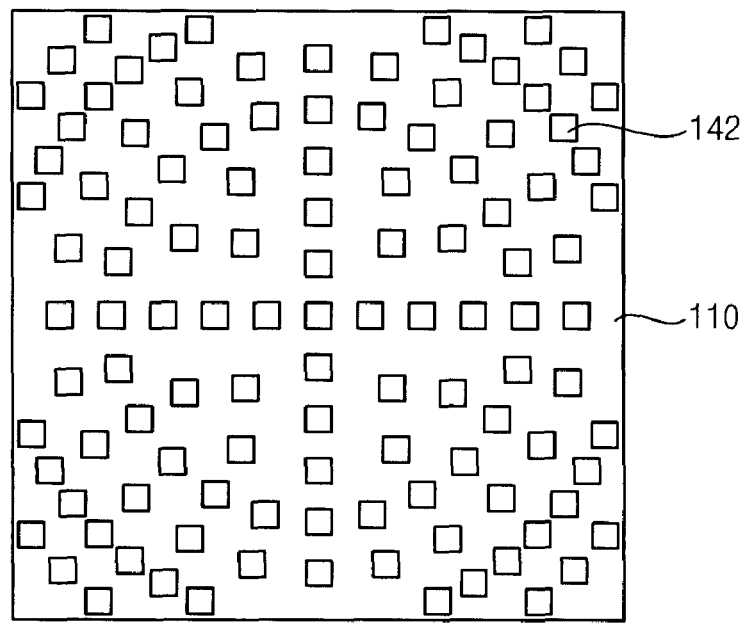
FIG. 3 is a plan view illustrating a conductive layer pattern in accordance with an example embodiment of the present invention.

FIG. 3 is a plan view illustrating a conductive layer pattern in accordance with an example embodiment of the present invention.

Referring to FIG. 3, the elements forming the conductive layer pattern 142 may be spaced apart from one another, as in the example embodiment of FIG. 2. For example, elements of the conductive layer patterns 142 may be disposed in the form of a concentric circle. A center of the concentric circle may be a center of the rear face of the substrate 110.

Figure 4:
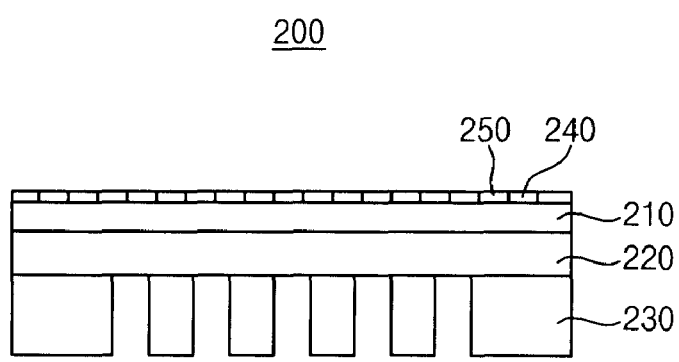
FIG. 4 is a cross-sectional view illustrating a reflecting mask in accordance with an example embodiment of the present invention.

FIG. 4 is a cross-sectional view, or side elevation, illustrating a reflecting mask in accordance with an example embodiment of the present invention.

Referring to FIG. 4, the reflecting mask 200 includes a substrate 210, a reflecting layer 220, an absorbing layer pattern 230, a conductive layer pattern 240 and an insulating layer pattern 250.

The substrate 210, the reflecting layer 220, the absorbing layer pattern 230 and the conductive layer pattern 240 are substantially the same as the substrate 110, the reflecting layer 120, the absorbing layer pattern 130 and the conductive layer pattern 140, respectively, as shown in FIGS. 1 and 2. In addition the conductive layer pattern 240 may be substantially the same as the conductive layer pattern 142 shown in FIG. 3.

The insulating layer pattern 250 may be formed so as to reside between the elements forming the conductive layer pattern 240. The insulating layer pattern 250 is then insulates the elements forming the conductive layer pattern 240 from one another. A height or thickness of the insulating layer pattern 250 may be substantially the same as a height of the conductive layer pattern 240. Thus, a surface of the conductive layer pattern 240 may be substantially coplanar with a surface of the insulating layer pattern 250. As a result, the reflecting mask 200 may be effectively fixed to the electrostatic chuck (not shown). That is, the total area of the reflecting mask 200 making contact with the electrostatic chuck may be increased.

Figure 5:
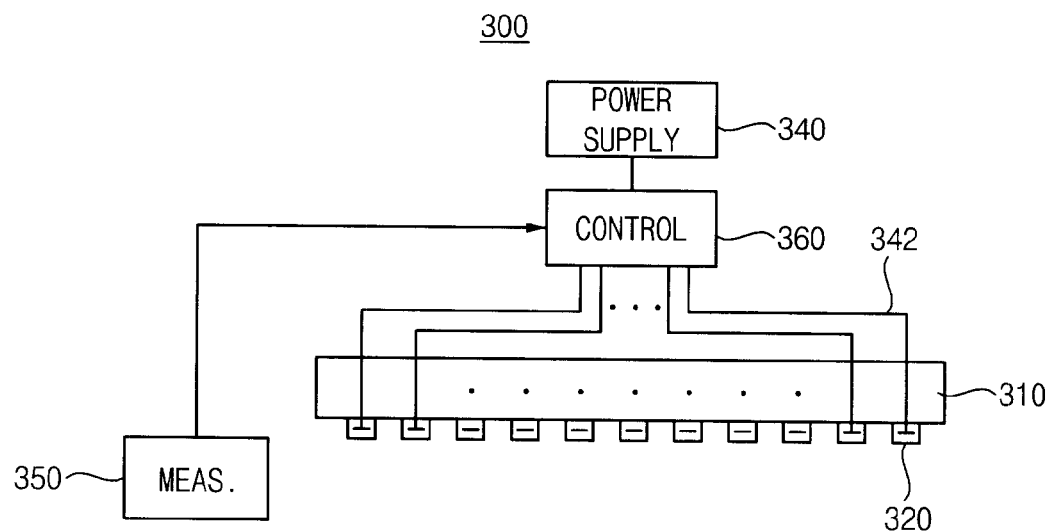
FIG. 5 is a schematic view illustrating an apparatus for fixing a reflecting mask in accordance with an example embodiment of the present invention.

FIG. 5 is a schematic view illustrating an apparatus for fixing a reflecting mask in accordance with an example embodiment of the present invention.

Referring to FIG. 5, the apparatus for fixing the reflecting mask 300 includes a body 310, a plurality of protrusions 320, a power supplying part 340, a measuring part 350 and a controller 360.

The shape of the body 310 may correspond to a shape of the reflecting mask that is shown in FIGS. 2 and 3, for example. For example, the body 310 may have a quadrilateral plate shape, and the body 310 may be made of aluminum.

Figure 6:
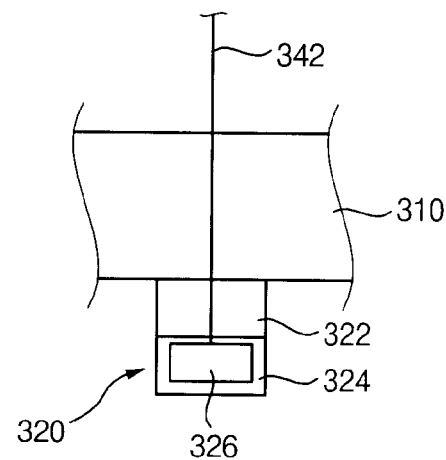
FIG. 6 is a cross-sectional view illustrating one of the protrusions shown in FIG. 5.
Figure 7:
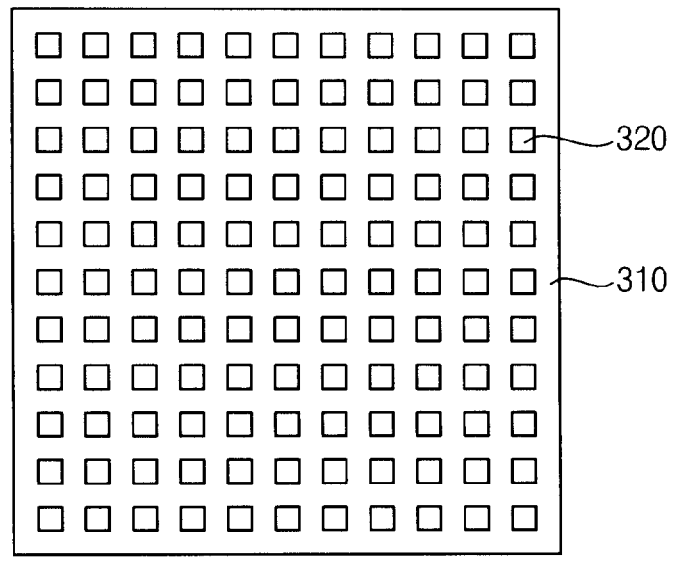
FIG. 7 is a plan view illustrating an alignment of the protrusions shown in FIG. 5.

FIG. 6 is a cross-sectional view illustrating one of the protrusions 320 shown in FIG. 5 in more detail. FIG. 7 is a plan view illustrating an alignment of the protrusions in FIG. 5.

Referring to FIGS. 6 and 7, the protrusion 320 is protruded from the body 310. The protrusions 320 are spaced apart from one another. In this example embodiment, the protrusions 320 are disposed substantially in a matrix. Each protrusion 320 is formed on the body 310 and includes an insulating layer 322 and a dielectric layer 324 formed on the insulating layer 322. The dielectric layer 324 abuts and supports the reflecting mask, shown in FIG. 1 for example. An electrode 326 is located inside the dielectric layer 324, and a voltage is applied to the electrode 326 through an electrical conductor 342. The reflecting mask includes a conductive layer pattern having a shape corresponding to the arrangement of the protrusions 320 of the apparatus for fixing the reflecting mask, so that the reflecting mask may be effectively fixed to the apparatus by attracting the conductive layer pattern. Therefore, the plurality of protrusions 320 may contact the elements forming the conductive layer pattern, respectively. For example, the reflecting mask in FIGS. 1 to 4 may be used as the reflecting mask with the apparatus of FIG. 5.

The conductive layer pattern of the reflecting mask makes contact with the dielectric layer 324 of the protrusion 320. The voltage is then applied to the electrode 326. When the voltage is applied to the electrode 326, an electrostatic force is generated between the electrode 326 and the dielectric layer 324. The conductive layer pattern making contact with the dielectric layer 324 may be fixed by the electrostatic force, so that the reflecting mask may be firmly affixed to the protrusion 320.

FIG. 7 is a plan view illustrating an alignment of the protrusions in accordance with an example embodiment of the present invention in which a plurality of protrusions 320 are arranged in a matrix on the body 310.

Figure 8:
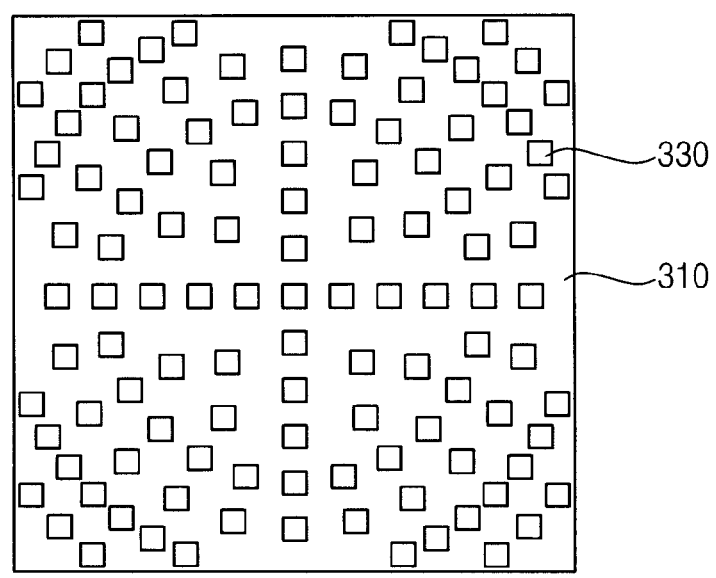
FIG. 8 is a plan view illustrating an alignment of the protrusions in accordance with an example embodiment of the present invention.

FIG. 8 is a plan view illustrating an alignment of the protrusions in accordance with an example embodiment of the present invention.

Referring to FIGS. 5 and 8, each of the protrusions 330 is protruded from the body 310, and the protrusions 330 are spaced apart from one another. For example, the protrusions 330 may be disposed in a concentric circle, and a center of the concentric circle shape may be a center of the body 310.

The power supplying part 340 is electrically connected to the electrode 326 in the protrusions 320 by the electrical conductor 342. The power supplying part 340 applies the voltage to the electrode 326 to create the electrostatic force and fix the reflecting mask.

The measuring part 350 may be disposed adjacent the protrusions 320. The measuring part 350 measures a flatness of the reflecting mask fixed to the protrusions 320. The measuring part 350 then transmits the measured flatness of the reflecting mask to the controller 360.

The controller 360 is connected to the electrodes 324 through the electrical conductors 342. The controller 360 may control the voltage applied to each electrode 336 through the respective electrical conductor 342 to adjust individually the electrostatic force of each protrusion 320. Therefore, the electrostatic force fixing the reflecting mask may be controlled at each protrusion 320.

More specifically, the controller 360 adjusts the voltage applied to each electrode 336 in accordance with a measured result of the measuring part 350, so that the reflecting mask may be horizontally fixed onto the protrusion 320.

The apparatus for fixing the reflecting mask 300 may provide different electrostatic forces to the conductive layer pattern of the reflecting mask. Thus, the apparatus for fixing the reflecting mask 300 adjusts the electrostatic forces provided to the conductive layer pattern, so that the reflecting mask may be horizontally fixed onto the apparatus for fixing the reflecting mask 300. Horizontally fixed means that the reflecting mask 300 is flat after it has been finally affixed to the protrusions 320.

Figure 9:
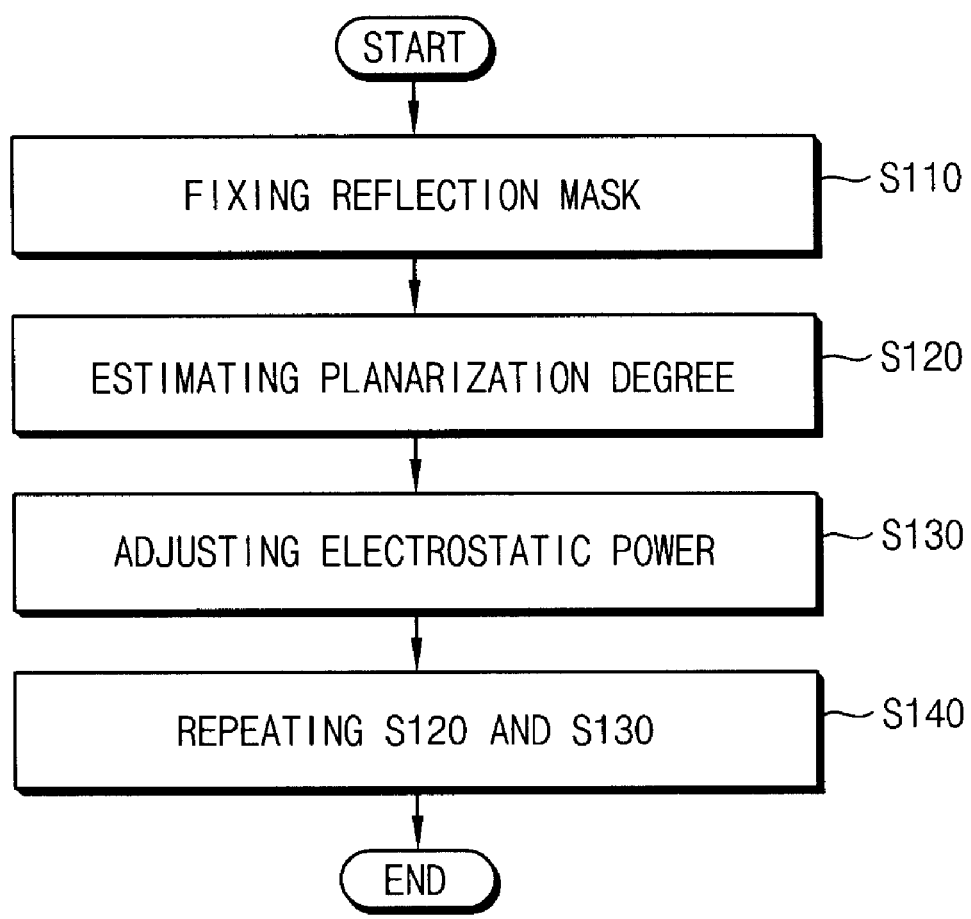
FIG. 9 is a flow chart illustrating a method of fixing a reflecting mask in accordance with an example embodiment of the present invention.

FIG. 9 is a flow chart illustrating a method of fixing a reflecting mask in accordance with an example embodiment of the present invention.

Referring to FIG. 9 and to FIGS. 1 and 5, a reflecting mask 100 having a conductive layer pattern 140 and an apparatus for fixing the reflecting mask 300 having protrusions 320 are provided. The conductive layer pattern 140 is formed on a rear face of a substrate 110. The elements forming the conductive layer pattern 140 are spaced apart from one another such that the elements of the conductive layer pattern 140 may be disposed in a matrix. Each protrusion 320 may have a shape corresponding to a shape of each element forming the conductive layer pattern 140. The elements of the conductive layer pattern 140 spaced apart from one another may be disposed in a shape substantially the same as a shape in which the protrusions 320 spaced apart from one another are disposed.

The conductive layer pattern 140 of the reflecting mask 100 makes contact with a dielectric layer 324 of the protrusions 320. The power supplying part 340 may apply a voltage to electrodes 326 respectively formed in the protrusions 320.

The voltage applied to each electrode 326 may be individually controlled by a controller 360 in response to a determination of flatness by the measuring part 350. In this example embodiment, substantially the same voltages may be respectively applied to the electrodes 326, or, alternatively, different voltages may be respectively applied to the electrodes 326. Generally, an electrostatic force provided to a central portion of the reflecting mask 100 may be larger than that provided to an edge portion of the reflecting mask 100. The voltage applied to the electrode 326 disposed at an edge portion of a body 310 may be larger than that applied to the electrode 326 disposed at a central portion of the body 310, so that the reflecting mask 100 may be horizontally fixed onto the apparatus for fixing the reflecting mask 300 such that the reflecting mask 100 is flat.

The voltages that are applied to the electrodes 326 are controlled by the controller 360.

When the voltage is applied to the electrode 326, the electrostatic force is generated between the electrode 326 and the conductive layer pattern 140. The conductive layer pattern 140 making contact with the dielectric layer 324 by the electrostatic force is fixed so that the reflecting mask 100 may be fixed to the apparatus for fixing the reflecting mask 300 in step S110.

Thereafter, the measuring part 350 measures a flatness of the reflecting mask 100 fixed to the protrusion 320 in step S120.

In case that a result measured by the measuring part 350 is in a predetermined range of flatness, a pattern image of the reflecting mask 100 is transferred onto a wafer (not shown) by an exposure process using the fixed reflecting mask 100.

In case that the measured result is not in the predetermined range of flatness, the measuring part 350 transmits the measured result concerning the flatness of the reflecting mask 100 to the controller 360.

The measuring part 350 is disposed adjacent the protrusion 320 to measure the flatness of the reflecting mask 100 fixed to the protrusion 320. In addition, the measuring part 350 transmits the measured result concerning the flatness of the reflecting mask 100 to the controller 360.

The controller 360 controls the voltages respectively applied the electrodes 326 through the electrical conductors 342 in accordance with the result measured by the measuring part 350 to allow the reflecting mask to be horizontally fixed onto the protrusions 320. Therefore, the electrostatic force of each protrusion 320 may be controlled in step S130.

The electrostatic force of each protrusion 320 may be controlled using a relationship between the electrostatic force generated by the voltage applied to each electrode and the flatness of the reflecting mask 100 depending on the electrostatic force.

Thereafter, the flatness of the reflecting mask 100 is repeatedly measured and the electrostatic force of each protrusion 329 is repeatedly controlled until the measured result of the measuring part 350 is in the predetermined range of flatness in step S140.

In case that the measured result is in the predetermined range of flatness the pattern image of the reflecting mask 100 is transferred onto a wafer (not shown) by an exposure process employing the fixed reflecting mask 100.

Figure 10:
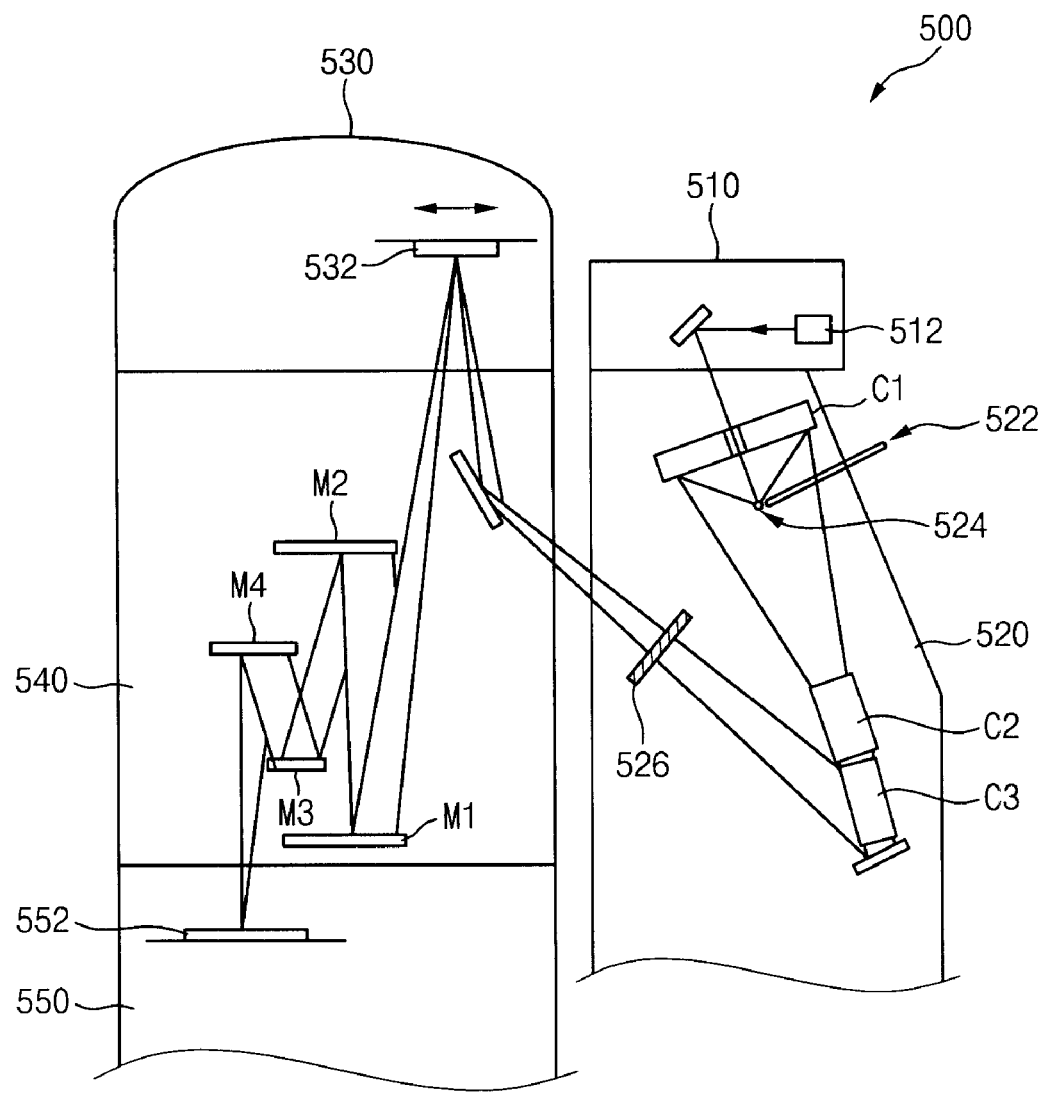
FIG. 10 is a schematic view illustrating an exposure apparatus employing extreme ultraviolet light.

FIG. 10 is a schematic view illustrating an exposure apparatus employing extreme ultraviolet light.

Referring to FIG. 10, a laser beam irradiated from a laser source 512 included in an exposure apparatus 500 is reflected by a mirror in laser drive optics 510. Thereafter, the laser beam proceeds through an optical lens C1 located in an illuminator 520. In this example embodiment, the laser proceeding through the optical lens C1 excites a xenon gas provided through a xenon gas supplying pipe 522. Thus, a plasma source is formed by the laser. An extreme ultraviolet light source is generated from the plasma source. The extreme ultraviolet light proceeds through a plurality of lenses C2 and C3, and a portion of the extreme ultraviolet light is reflected by the lenses C2 and C3. The extreme ultraviolet light is then filtered by a spectral purity filter 526. The filtered extreme ultraviolet light is then provided to a reflecting mask stage chamber 530.

A reflecting mask may be installed in the reflecting mask stage chamber 530, such that the reflecting mask may be movable. The reflecting mask 532 is affixed to an electrostatic chuck (not shown). The extreme ultraviolet light provided onto the aligned reflecting mask 532 is reflected by the reflecting mask 532, so that the extreme ultraviolet may have a brightness profile used to form a pattern. Thereafter, the extreme ultraviolet light is reflected by the reflecting mask 532 into a camera chamber 540. The extreme ultraviolet light is then reflected by a plurality of mirrors M1, M2, M3 and M4. Thereafter, the reflected extreme ultraviolet light is provided into a wafer stage chamber 550. A wafer 552 that is to be patterned is installed in the wafer stage chamber 550 in a manner such that the wafer 552 may be movable. The extreme ultraviolet light is then provided to the wafer 552 suitably aligned in the wafer stage chamber 550, so that the pattern may be formed on the wafer 552.

According to example embodiments of the present invention, the apparatus for fixing the reflecting mask includes the protrusions spaced apart from one another. In addition, the reflecting mask includes the conductive patterns spaced apart from one another such that the conductive patterns respectively correspond to the protrusions. The apparatus may adjust the electrostatic forces provided to the conductive patterns of the reflecting mask so that the reflecting mask may be horizontally fixed onto the apparatus such that the reflecting mask is substantially flat.

Accordingly, an exposure process may be performed with the flat reflecting mask that is horizontally fixed. Therefore, a pattern shift and a focus error may be prevented from being generated on the wafer during the exposure process.

The foregoing is illustrative of example embodiments of the present invention and is not to be construed as limiting thereof. Although example embodiments of this invention have been described, those of ordinary skill in the art will readily appreciate that many modifications are possible in the example embodiments without materially departing from the novel teachings and advantages of this invention. Accordingly, all such modifications are intended to be included within the scope of this invention as defined in the claims. Therefore, it is to be understood that the foregoing is illustrative of the present invention and is not to be construed as limited to the specific embodiments disclosed, and that modifications to the disclosed example embodiments, as well as other embodiments, are intended to be included within the scope of the appended claims. The invention is defined by the following claims, with equivalents of the claims to be included therein.

What is claimed is:

1. A reflecting mask comprising:

a substrate;

a reflecting layer formed on a front face of the substrate to reflect extreme ultraviolet light;

an absorbing mask pattern formed on the reflecting layer to absorb the extreme ultraviolet light;

a conductive layer pattern having elements spaced apart from one another on a rear face of the substrate, the conductive layer pattern being used to fix the substrate to an electrostatic chuck providing an electrostatic force; and an insulating layer pattern formed between the elements the conductive layer pattern to insulate the elements of the conductive layer pattern from one another.

2. The reflecting mask of claim 1, wherein the elements of the conductive layer pattern are disposed substantially in a matrix.

3. The reflecting mask of claim 1, wherein the elements of the conductive layer pattern are disposed in concentric circles.

4. The reflecting mask of claim 1, wherein a height of the conductive layer pattern is substantially the same as a height of the insulating layer pattern.

* * * * *